(12) United States Patent
Kumph

(10) Patent No.: US 11,750,175 B2
(45) Date of Patent: Sep. 5, 2023

(54) MULTIPLEXING RESONATOR INDUCED PHASE GATE DRIVE SIGNALS

(71) Applicant: International Business Machines Corporation, Armonk, NY (US)

(72) Inventor: Muir Kumph, Croton on Hudson, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 237 days.

(21) Appl. No.: 17/025,642

(22) Filed: Sep. 18, 2020

(65) Prior Publication Data

US 2022/0094338 A1 Mar. 24, 2022

(51) Int. Cl.
H03K 17/00 (2006.01)
H03H 11/04 (2006.01)
G06N 10/00 (2022.01)
H03K 17/92 (2006.01)

(52) U.S. Cl.
CPC ............. *H03H 11/04* (2013.01); *G06N 10/00* (2019.01); *H03K 17/92* (2013.01)

(58) Field of Classification Search
CPC ......... H03H 11/04; H03K 17/92; G06N 10/00
See application file for complete search history.

(56) References Cited

U.S. PATENT DOCUMENTS

| 9,685,935 | B2 | 6/2017 | Strand |
| 10,043,136 | B1 | 8/2018 | Abdo |
| 10,540,603 | B2 | 1/2020 | Naaman et al. |
| 2018/0145631 | A1 | 5/2018 | Berkley |
| 2018/0330267 | A1 | 11/2018 | Rigetti et al. |
| 2019/0044668 | A1 | 2/2019 | Elsherbini et al. |
| 2019/0369171 | A1 | 12/2019 | Swenson et al. |
| 2022/0029919 | A1* | 1/2022 | Chen ............... H04L 47/2433 |
| 2022/0180235 | A1* | 6/2022 | Kumph ............ G06N 10/40 |

FOREIGN PATENT DOCUMENTS

WO 2019117949 A1 6/2019

OTHER PUBLICATIONS

Krantz, et al. "A Quantum Engineer's Guide to Superconducting Qubits" arXiv:1904.06560v3 [quant-ph] Aug. 9, 2019, 66 pages.
International Search Report and Written Opinion received for PCT Application Serial No. PCT/EP2021/075380 dated Jan. 28, 2022, 15 pages.
Shi et al., "Demonstration of Channel Multiplexing Quantum Communication Exploiting Entangled Sideband Modes", Physical Review Letters, vol. 125, No. 7, Aug. 14, 2020, 6 pages.
(Continued)

*Primary Examiner* — Tuan T Lam
(74) *Attorney, Agent, or Firm* — Amin, Turocy & Watson, LLP

(57) ABSTRACT

Techniques regarding quantum gate coupling are provided. For example, one or more embodiments described herein can comprise a method for driving multiple resonator induced phase gates from the same signal control line. The method can comprise controlling quantum gate coupling, via a quantum circuit, by filtering a resonator induced phase gate signal from a signal control line that is multiplexed with a plurality of resonator induced phase gate signals.

17 Claims, 10 Drawing Sheets

(56) References Cited

OTHER PUBLICATIONS

Han et al., "Multi-qubit phase gate on multiple resonators mediated by a superconducting bus", Optics express, vol. 28, No. 2, Jan. 20, 2020, pp. 1954-1969.

Han et al., "Constructing multi-target controlled phase gate in circuit QED and its applications", 2019, vol. 127, 8 pages.

Ye et al., "Multiplex-controlled phase gate with qubits distributed in a multi-cavity system", Physical Review, Jun. 12, 2018, 15 pages.

Said et al., "Implementing N-quantum phase gate via circuit QED with qubit-qubit interaction", Modern Physics Letters B:, vol. 30, No. 05, Feb. 20, 2016, 14 pages.

\* cited by examiner

802 — SETTING, VIA A QUANTUM CIRCUIT, A BANDWIDTH OF A FILTER RESONATOR BY ADJUSTING A COUPLING CAPACITANCE BETWEEN THE FILTER RESONATOR AND A SIGNAL CONTROL LINE THAT IS MULTIPLEXED WITH A PLURALITY OF RIP GATE SIGNALS

804 — CONTROLLING QUANTUM GATE COUPLING, VIA THE QUANTUM CIRCUIT, BY FILTERING A RIP GATE SIGNAL FROM THE SIGNAL CONTROL LINE, WHEREIN THE RIP GATE SIGNAL IS FILTERED FROM THE SIGNAL CONTROL LINE BY THE FILTER RESONATOR BASED ON FREQUENCY IN ACCORDANCE WITH THE BANDWIDTH

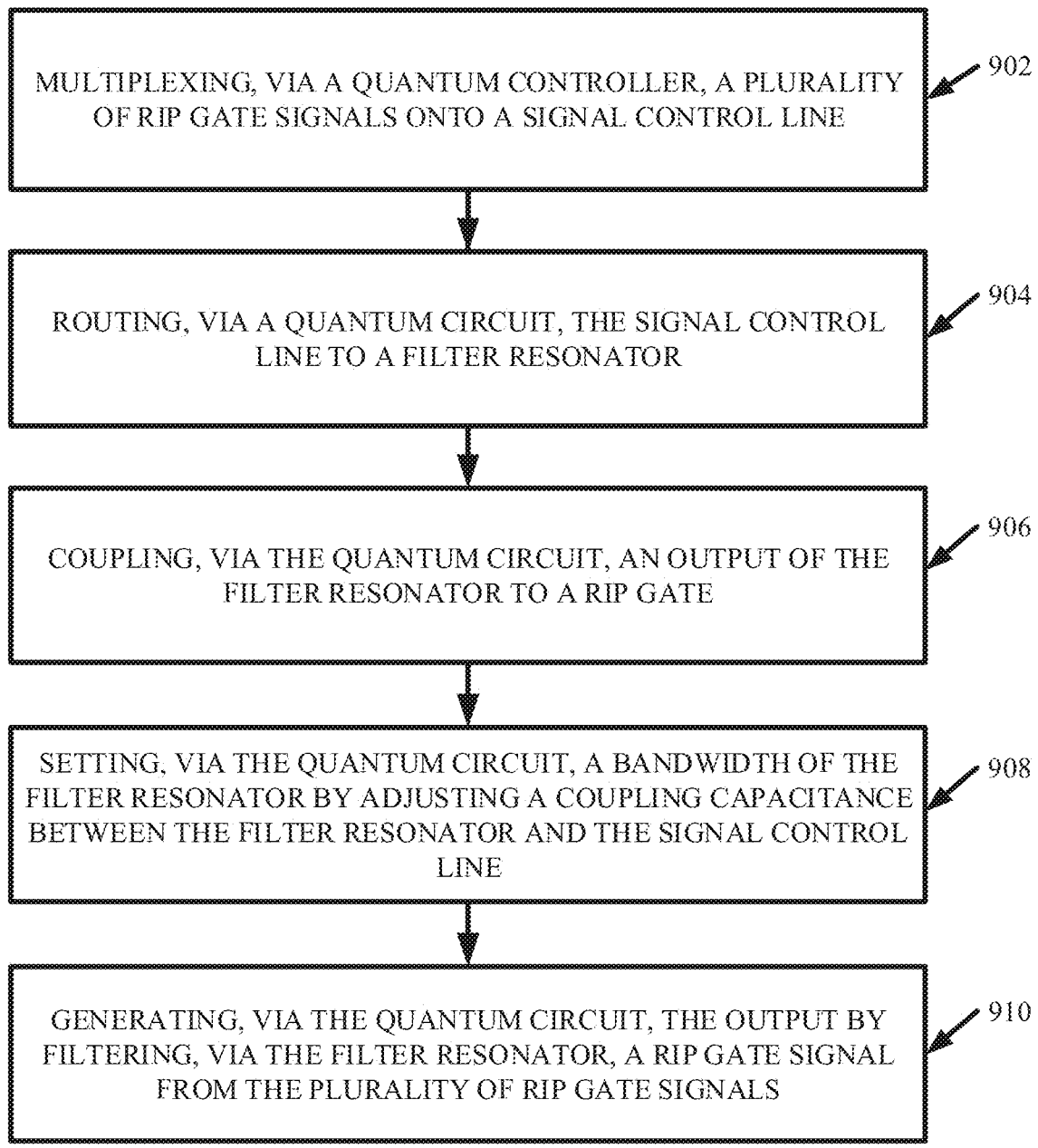

MULTIPLEXING RESONATOR INDUCED PHASE GATE DRIVE SIGNALS

BACKGROUND

The subject disclosure relates to multiplexing signals that drive resonator induced phase ("RIP") gates, and more specifically, to frequency multiplexing a plurality of RIP gate signals onto a control line of a quantum circuit.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, methods, and/or apparatuses regarding multiplexing RIP gate signals are described.

According to an embodiment, a method is provided. The method can comprise controlling quantum gate coupling, via a quantum circuit, by filtering a resonator induced phase gate signal from a signal control line that is multiplexed with a plurality of resonator induced phase gate signals.

According to another embodiment, a method is provided. The method can comprise routing, via the quantum circuit, a signal control line to a filter resonator. A plurality of resonator induced phase gate signals can be multiplexed onto the signal control line. The method can also comprise coupling, via the quantum circuit, an output of the filter resonator to a resonator induced phase gate.

According to an embodiment, a system is provided. The system can comprise a resonator bus coupled to a filter resonator. The filter resonator can output a control tone that drives the resonator bus from a plurality of control tones multiplexed onto a quantum gate control line.

BRIEF DESCRIPTION OF THE DRAWINGS

FIG. 8 illustrates a flow diagram of an example, non-limiting method for controlling quantum gate coupling in accordance with one or more embodiments described herein.

FIG. 9 illustrates a flow diagram of an example, non-limiting method for routing RIP gate signals in a quantum circuit in accordance with one or more embodiments described herein.

DETAILED DESCRIPTION

Figure 1:
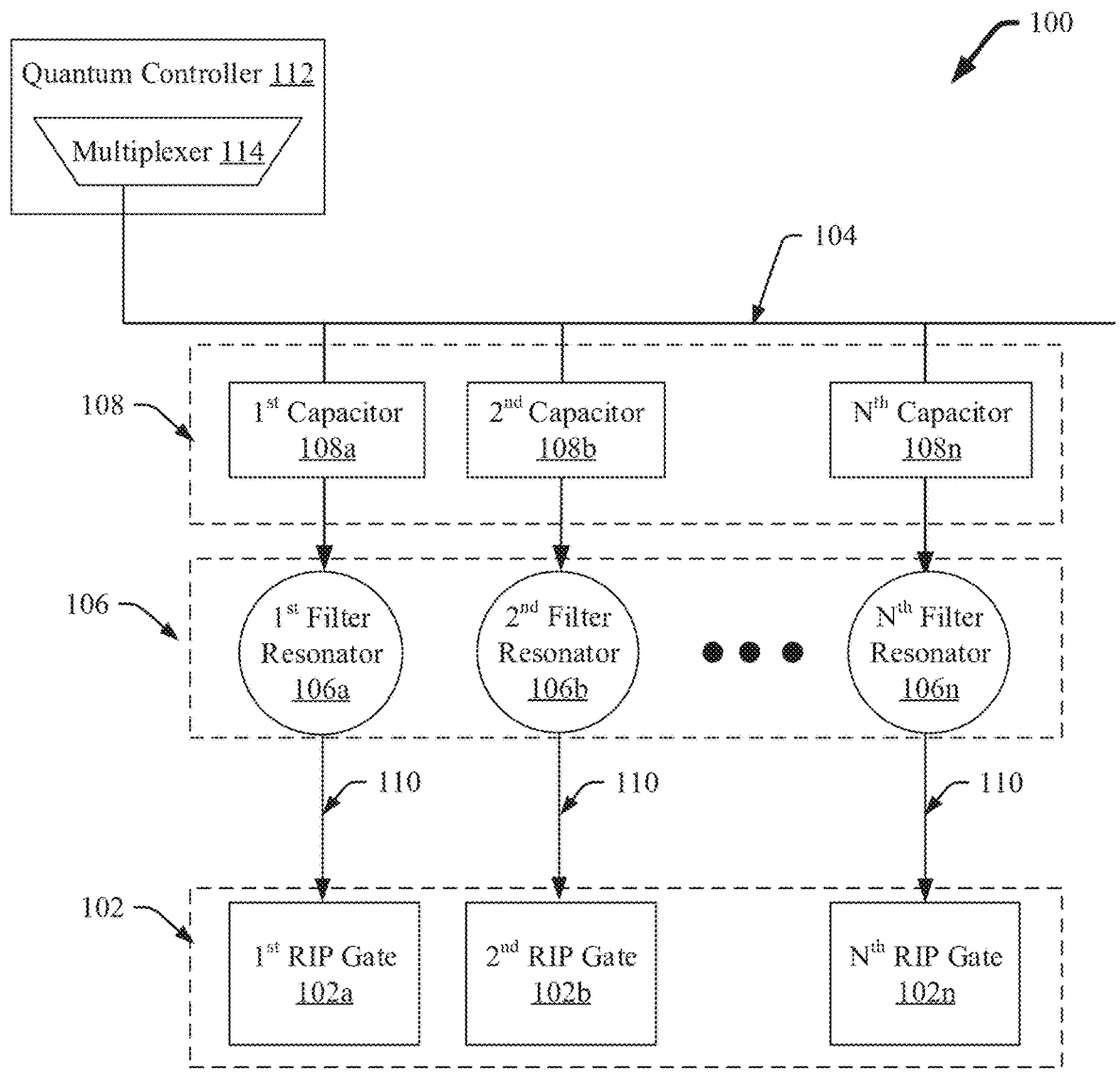
FIG. 1 illustrates a block diagram of an example, non-limiting quantum circuit layout that can frequency multiplex a plurality of RIP gate signals onto a control line to drive a plurality of RIP gates in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

RIP gates are one way to produce a quantum logical gate between qubits in a quantum circuit. Traditionally, controlling RIP gates require at least one drive line per qubit pair. As a result, employing RIP gates to control quantum coupling can be limited by the required number of drive lines. For example, as the number of qubits comprised within the quantum circuit increases, the number of required drive lines can also increase. The increase in drive lines can thereby necessitate an increase in the quantum circuit's size at least because positioning drive lines in close proximity to each other can have undesirable effects on the quantum circuit.

Various embodiments described herein can include methods, systems, and/or apparatuses for controlling quantum gate coupling using a plurality of RIP gates driven from the same control line. One or more embodiments described herein can regard a quantum circuit that couples various qubits via one or more RIP gates. Further, the one or more RIP gates can be driven by RIP gate signals that are multiplexed onto a common control line. In various embodiments, each RIP gate can be coupled to the control line via a filter resonator and a capacitor. The filter resonator can filter the RIP gate's drive signal from the multiplexed control signal of the control line. Further, the bandwidth of the filter resonator can be tuned by adjusting the coupling capacitance established by the capacitor. Thereby, the drive line layout can be condensed and cross-talk between RIP gates can be reduced to an acceptable level that is compatible with 99.99% fidelity gates. Additionally, relaxation times of the Purcell effect can be enhanced by the filter resonators. Further, a thermal photon number of the RIP gates can be reduced by the cold on-chip filter resonators.

RIP gates are a form of quantum logic gate that can couple superconducting qubits. RIP gates can be all-microwave multi-qubit entanglement gates that can enable a high degree of flexibility in qubit frequencies. RIP gates can operate by coupling two or more fixed-frequency qubits to a resonator bus. By adiabatically applying and removing an off-resonate pulse to the resonator bus, the system can undergo a closed loop in phase space, after which the resonator bus can be left unchanged white the qubits acquire a state-dependent phase. In various embodiments, RIP gates can be employed to control qubit coupling in a circuit quantum electrodynamics ("circuit-QED").

As described herein the term "superconducting" can characterize a material that exhibits superconducting properties at or below a superconducting critical temperature, such as aluminum (e.g., superconducting critical temperature of 1.2 Kelvin) or niobium (e.g., superconducting critical temperature of 9.3 Kelvin). Additionally, one of ordinary skill in the art will recognize that other superconductor materials (e.g., hydride superconductors, such as lithium/magnesium hydride alloys) can be used in the various embodiments described herein.

FIG. 1 illustrates a diagram of an example, non-limiting quantum circuit layout 100 that can exemplify the coupling of multiple RIP gates 102 to a common signal control line 104 in accordance with one or more embodiments described herein. Repetitive description of like elements employed in other embodiments described herein is omitted for sake of brevity. As shown in FIG. 1, a plurality of "N" RIP gates 102 can be coupled to the same signal control line 104, where "N" is a positive integer. For example, a plurality of RIP gates 102 coupled to the signal control line 104 can include, but are not limited to: a first RIP gate 102a, a second RIP gate 102b, and one or more additional RIP gates 102 up to an "Nth" RIP gate 102n (e.g., where "N" is an integer greater than 2). In various embodiments, the number of RIP gates 102 coupled to the same signal control line 104 can be, for example, greater than or equal to 1 and less than or equal to 100. In various embodiments, each RIP gate 102 can couple two or more superconducting qubits (e.g., as described further herein).

The RIP gates 102 can be coupled to the common signal control line 104 via a plurality of filter resonators 106 and capacitors 108. As shown in FIG. 1, each of the RIP gates 102 can be coupled to a respective filter resonators 106 via a drive line 110. In various embodiments, the drive lines 110 can be superconductor resonator lines. For example, the first RIP gate 102a can be coupled to a first filter resonator 106a, the second RIP gate 102b can be coupled to a second filter resonator 106b. Where the quantum circuit layout 100 comprises "N" RIP gates 102, the "Nth" RIP gate 102n can be coupled to a "Nth" filter resonator 106n. In various embodiments, the filter resonators 106 can be band-pass filter resonators and/or band-stop filter resonators. Example types of filters that can be employed as the filter resonators 106 can include, but are not limited to: co-planar waveguides, cavity band-pass or cavity band-stop filters, lumped elements, a combination thereof, and/or the like. In one or more embodiments, one or more of the filter resonators 106 can be band-pass filters (e.g., passive or active band-pass filters) derived from cascading high-pass and low-pass filters (e.g., passive or active high-pass and low-pass filters). In one or more embodiments, the one or more filter resonators 106 can be band-stop filters (e.g., passive or active band-stop filters) derived from cascading high-pass and low-pass filters (e.g., passive or active high-pass and low-pass filters) coupled to a summer circuit.

The filter resonators 106 can further be coupled to the signal control line 104 via the capacitors 108. As shown in FIG. 1, each of the filter resonators 106 can be coupled to a respective capacitor 108. For example, the first filter resonator 106a can be coupled to a first capacitor 108a, the second filter resonator 106b can be coupled to a second capacitor 108b. Where the quantum circuit layout 100 comprises "N" RIP gates 102, the "Nth" filter resonator 106n can be coupled to a "Nth" capacitor 108n. In various embodiments, the capacitors 108 can control the coupling capacitance between the signal control line 104 and the filter resonators 106. Further, the coupling capacitance established by the capacitors 108 can influence the bandwidth of the filter resonators 106. For example, the bandwidth of the first filter resonator 106a can be tuned by setting the capacitance of the first capacitor 108a. Likewise, the bandwidth of the second filter resonator 106b can be tuned by setting the capacitance of the second capacitor 108b. Where the quantum circuit layout 100 comprises "N" RIP gates 102, the bandwidth of the "Nth" filter resonator 106n can be tuned by setting the capacitance of the "Nth" capacitor 108n.

As show in FIG. 1, the signal control line 104 can be further coupled to one or more quantum controllers 112. The one or more quantum controllers 112 can control stimulation of the various qubits coupled to the RIP gates 102. For example, the quantum controller 112 can control one or more signals carried by the signal control line 104. In various embodiments, the one or more quantum controllers 112 can include one or more multiplexers 114 that can frequency division multiplex a plurality of RIP gate signals onto the signal control line 104 to control the plurality of RIP gates 102 coupled to the signal control line 104.

As described further herein, a plurality of RIP gate signals can be frequency multiplexed onto the signal control line 104 by the quantum controller 112 (e.g., multiplexer 114). Each RIP gate 102 can be driven by a respective RIP gate signal from the plurality of multiplexed signals. Further, the filter resonators 106 can filter out respective RIP gate signals from the multiplexed signal based on frequency. For example, the coupling capacitance established by the capacitors 108 can set the filtering frequency employed by the filter resonators 106. Additionally, the output of the filter resonators 106 can drive the RIP gates 102. In various embodiments, respective filter resonators 106 can be tuned by respective coupling capacitances to filter the multiplexed signal at respective frequency bands. Thereby, each RIP gate 102 can be driven by a different RIP gate signal despite the various RIP gate signals being sourced from the same signal control line 104.

Figure 2:
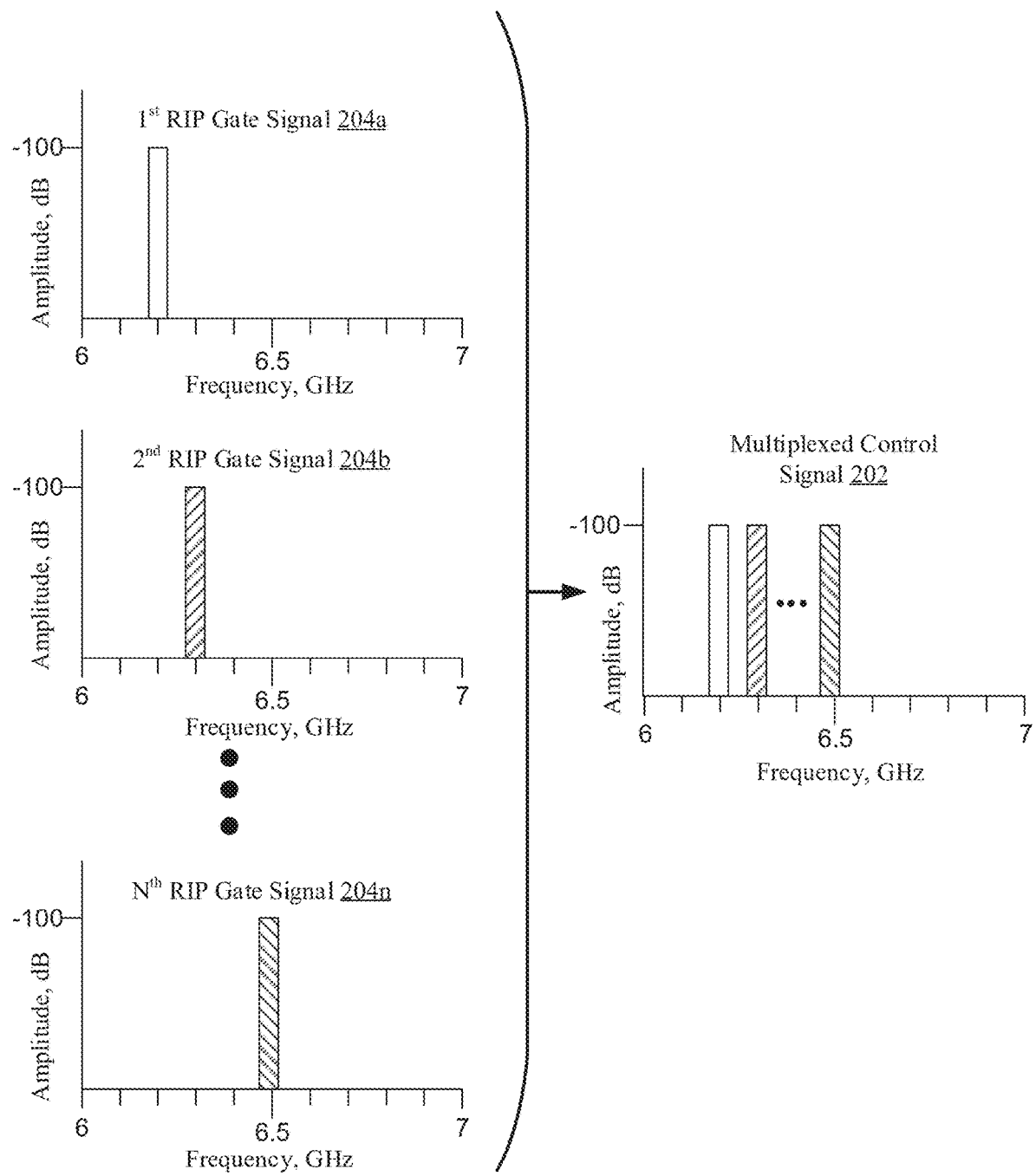
FIG. 2 illustrates a diagram of an example, non-limiting multiplexing scheme that can exemplify frequency multiplexing a plurality of RIP gate signals onto a control line in accordance with one or more embodiments described herein.

FIG. 2 illustrates a diagram of an example, non-limiting frequency multiplexing scheme 200 that can characterize the multiplexed control signal 202 carried on the signal control line 104 in accordance with one or more embodiments described herein. Repetitive description of like elements employed in other embodiments described herein is omitted for sake of brevity. In various embodiments, the frequency multiplexing scheme 200 can be employed by the quantum controller 112 via the multiplexer. In one or more embodiments, the quantum controller 112 can employ orthogonal frequency division multiplexing to multiplex the plurality of RIP signals onto the signal control line 104.

As shown in FIG. 2, the bandwidth of the multiplexed control signal can be divided into a series of non-overlapping frequency sub-bands, each of which can be used to carry a separate RIP gate signal. For example, a first RIP gate signal 204a can be carried on a frequency sub-band centered at 6.2 gigahertz (GHz). A second RIP gate signal 204b can be carried at a second frequency sub-band, such as a frequency sub-band centered at 6.3 GHz. Likewise, additional RIP gate signals can be carried at additional frequency bands, such as an "N" RIP gate signal 204n being carried on a frequency sub-band centered at 6.5 GHz. The multiplexed control signal 202 can be carried on the signal control line 104 to each of the filter resonators 106. The filter resonators 106 can then filter the RIP gate signals from the multiplexed control signal based on the frequency band divisions in accordance with tuning established by the resonator filter's 106 coupling capacitance.

Although frequency sub-bands centered at 6.2 GHz, 6.3 GHz, and 6.5 GHz are depicted in FIG. 2, the architecture of the frequency multiplexing is not so limited. One of ordinary skill in the art will recognize that multiplexed control signals 202 having additional, or alternate, frequency based divisions are also envisaged. For example, a RIP gate signal can be carried on a frequency sub-band centered at 6.1 or 6.4 GHz.

Figure 3:
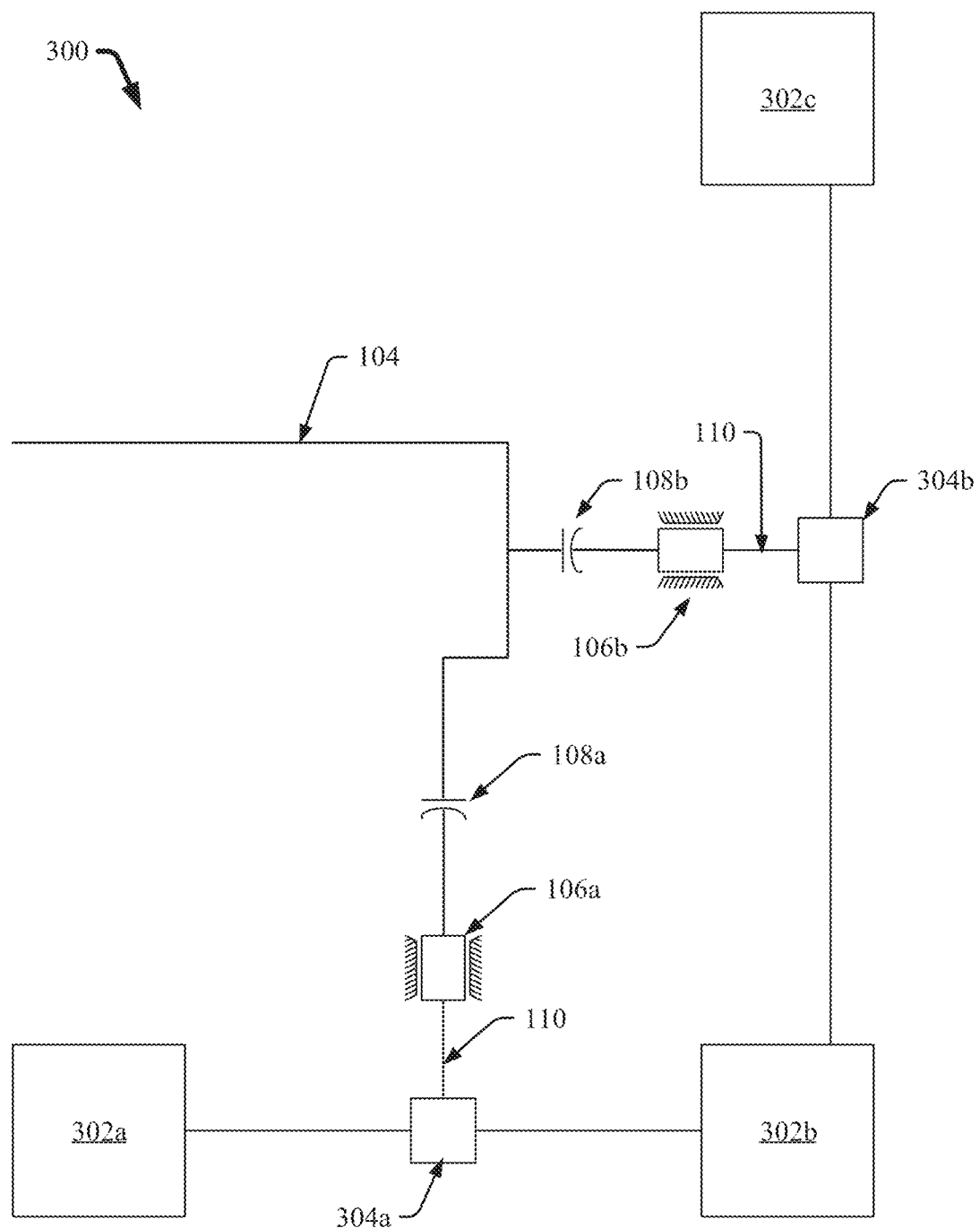
FIG. 3 illustrates a diagram of an example, non-limiting quantum circuit comprising at least three qubits operably coupled to at least two RIP gates driven from a single control line in accordance with one or more embodiments described herein.

FIG. 3 illustrates a diagram of an example, non-limiting quantum circuit 300 (e.g., a circuit-QED) that can comprise at least three qubits 302 coupled by at least two resonator buses 304 serving as RIP gates 102 in accordance with one or more embodiments described herein. Repetitive description of like elements employed in other embodiments described herein is omitted for sake of brevity. As shown in FIG. 3, the exemplary quantum circuit 300 can employ the various features of the quantum circuit layout 100 described herein.

The exemplary quantum circuit 300 depicted in FIG. 3 can comprise at least three qubits 302 (e.g., first qubit 302a, second qubit 302b, and/or third qubit 302c). One of ordinary skill in the art will recognize that a variety of qubit technologies can provide the basis for the one or more qubits 302. For instance, the qubits 302 can be superconducting qubits (e.g., such as superconducting quantum interference devices "SQUIDs") that can be lithographically defined electronic circuits that can be cooled to milli-Kelvin temperatures to exhibit quantized energy levels (e.g., due to quantized states of electronic charge or magnetic flux). Superconducting qubits can be Josephson junction-based, such as transmon qubits and/or the like. Also, superconducting qubits can be compatible with microwave control electronics, and can be utilized with gate-based technology or integrated cryogenic controls. In various embodiments, the qubits 302 can be fixed frequency superconducting qubits.

Further, coupling between the qubits 302 can controlled via at least two resonator buses 304, which can serve as RIP gates 102. For example, a first resonator bus 304a can couple the first qubit 302a and the second qubit 302b. Also, a second resonator bus 304a can couple the second qubit 302b and the third qubit 302c. In accordance with various embodiments described herein, the resonator buses 304 can be driven by the output of filter resonators 106. For example, the first resonator bus 302a can be driven by the output of the first filter resonator 106a. Also, the second resonator bus 302b can be driven by the output of the second filter resonator 106b. Additionally, the coupling capacitance, and thereby the bandwidth, of the filter resonators 106 can be defined by capacitors 108. For example, the first capacitor 108a can set the coupling capacitance of the first filter resonator 106a. Also, the second capacitor 108b can set the coupling capacitance of the second filter resonator 106b. In one or more embodiments, the filter resonators 106 can be band-pass filters, such as co-planar waveguides. Further, in various embodiments the signal control line 104 and/or the drive lines 110 can be superconducting resonator lines.

Example materials that can be comprised within the one or more signal control lines 104 and/or drive lines 110 can include, but are not limited to: niobium, aluminum, lead, indium, a combination thereof, and/or the like.

Figure 4:
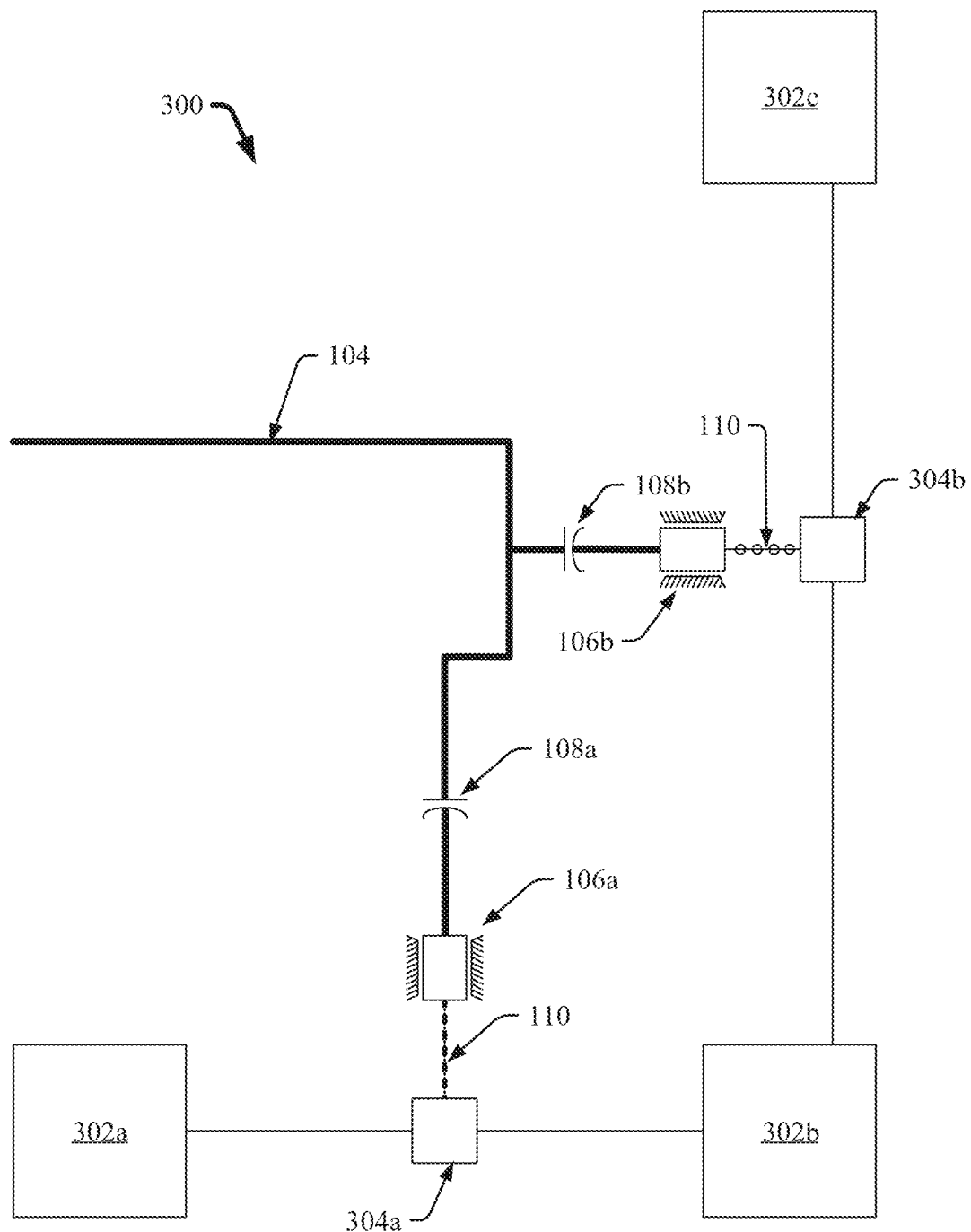
FIG. 4 illustrates a diagram of an example, non-limiting quantum circuit during operation, where the quantum circuit can comprise at least three qubits operably coupled to at least two RIP gates driven from a single control line in accordance with one or more embodiments described herein.

FIG. 4 illustrates a diagram of the example, non-limiting quantum circuit 300 during operation, where a frequency multiplexed control signal 202 can be carried by the signal control line 104 to control the resonator buses 304 in accordance with one or more embodiments described herein. Repetitive description of like elements employed in other embodiments described herein is omitted for sake of brevity. FIG. 4 exemplifies how the quantum circuit 300 can route RIP gate signals to a plurality of resonator buses 304 from a single signal control line 104.

As shown in FIG. 4, a frequency multiplexed control signal 202 can be represented by a bold black line and can be carried by the signal control line 104. For example, the frequency multiplexed control signal 202 can be multiplexed with the first RIP gate signal 204a and/or the second RIP gate signal 204b. In FIG. 4, the first RIP gate signal 204a can be represented by a dashed bold line carried on a drive line 110 coupled to the first filter resonator 106a. Additionally, the second RIP gate signal 204b can be represented by a plurality of open circles carried on a drive line 110 coupled to the second filter resonator 106b.

The signal control line 104 can carry the multiplexed control signal 202 (e.g., represented by a bold black line) to the first filter resonator 106a, which can thereby filter the multiplexed control signal 202 based on frequency to output the first RIP gate signal 204a (e.g., represented by a bold, dashed line). The first filter resonator 106a can output the first RIP gate signal 204a as a control tone that can be carried to the first resonator bus 304a via a drive line 110. The first filter resonator 106a can also block other RIP gate signals, such as the second RIP gate signal 204b, from being carried to the first resonator bus 304a. Thus, the first resonator bus 304a can be driven by just the first RIP gate signal 204a outputted by the first filter resonator 106a, and crosstalk from other RIP gate signals can be reduced by the first filter resonator 106a. In accordance with various embodiments described herein, the first filter resonator 106a can be tuned to the frequency band of the first RIP gate signal 204a by adjusting the coupling capacitance established by the first capacitor 108a.

Additionally, the signal control line 104 can carry the multiplexed control signal 202 (e.g., represented by a bold black line) to the second filter resonator 106b, which can thereby filter the multiplexed control signal 202 based on frequency to output the second RIP gate signal 204b (e.g., represented by open circles). The second filter resonator 106b can output the second RIP gate signal 204b as a control tone that can be carried to the second resonator bus 304b via another drive line 110. Also, the second filter resonator 106b can block other RIP gate signals, such as the first RIP gate signal 204a, from being carried to the second resonator bus 304b. Thus, the second resonator bus 304b can be driven by just the second RIP gate signal 204b outputted by the second filter resonator 106b, and crosstalk from other RIP gate signals can be reduced by the second filter resonator 106b. In accordance with various embodiments described herein, the second filter resonator 106b can be tuned to the frequency band of the second RIP gate signal 204b by adjusting the coupling capacitance established by the second capacitor 108b.

By setting the first capacitor 108a to a capacitance that is different than the capacitance of the second capacitor 108b, the first filter resonator 106a can filter the multiplexed control signal 202 at a different frequency band than the second filter resonator 106b. Thereby, the first filter resonator 106a can output a target RIP gate signal (e.g., first RIP gate signal 204a) while inhibiting propagation of other RIP gate signals (e.g., second RIP gate signal 204b) to the first resonator bus 304a. Likewise, the second filter resonator 106b can output another target RIP gate signal (e.g., second RIP gate signal 204b) while habiting the propagation of other RIP gate signals (e.g., first RIP gate signal 204a) to the second resonator bus 304b.

Figure 5:
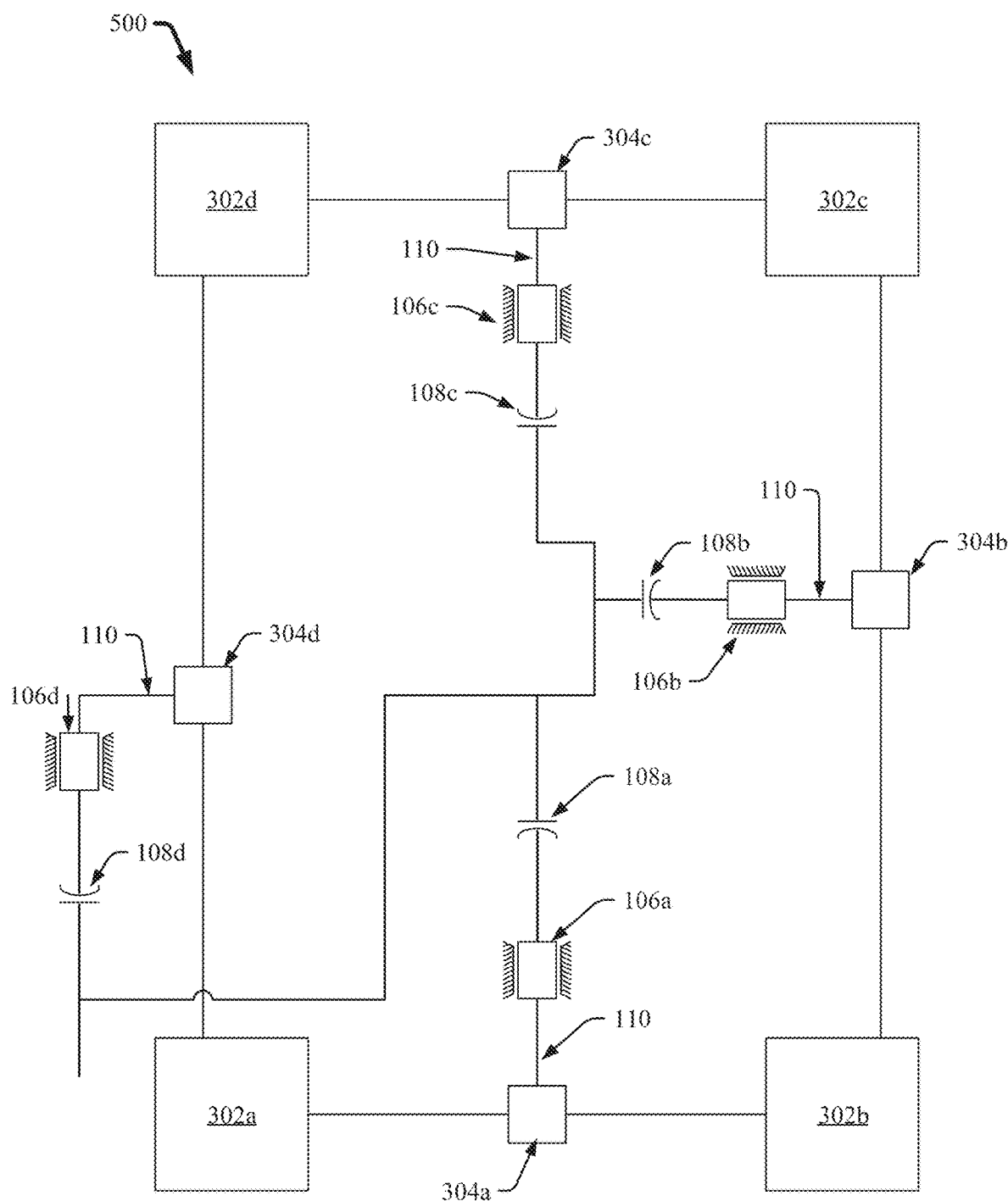
FIG. 5 illustrates a diagram of an example, non-limiting quantum circuit comprising at least four qubits operably coupled to at least four RIP gates driven from a single control line in accordance with one or more embodiments described herein.

FIG. 5 illustrates a diagram of another example, non-limiting quantum circuit 500 (e.g., a circuit-QED) that can comprise at least four qubits 302 coupled by at least four resonator buses 304 serving as RIP gates 102 in accordance with one or more embodiments described herein. Repetitive description of like elements employed in other embodiments described herein is omitted for sake of brevity. As shown in FIG. 5, the exemplary quantum circuit 300 can employ the various features of the quantum circuit layout 100 described herein. Quantum circuit 500 exemplifies that the architecture of the various embodiments described herein is not limited to two resonator buses 304 (e.g., the architecture is not limited to controlling two RIP gates 102). For instance, quantum circuit 500 can employ a single signal control line 104 to control more than two resonator buses 304, such as four resonator buses 304. Additionally, one of ordinary skill in the art will recognize that quantum circuits employing a single signal control line 104 to control more than four resonator buses 304 are also envisaged.

As compare to quantum circuit 300, exemplary quantum circuit 500 can comprise an additional fourth qubit 302d. Further, quantum circuit 500 can further comprise third resonator bus 304c and fourth resonator bus 304d to facilitate additional qubit 302 coupling. Quantum circuit 500 exemplifies that the features of quantum circuit layout 100 can be scaled based on the number of qubit couplings controlled by the quantum circuit. For example, as a quantum circuit employs more qubits 302, the circuit can control more RIP gates 102 and more RIP gate signals can be multiplexed onto the signal control line 104.

For example, a third resonator bus 304c can couple the third qubit 302c and the fourth qubit 302d. Also, a fourth resonator bus 304d can couple the fourth qubit 302d and the first qubit 302a. In accordance with various embodiments described herein, the resonator buses 304 can be driven by the output of filter resonators 106. For example, the third resonator bus 304c can be driven by the output of the third filter resonator 106c. Also, the fourth resonator bus 304d can be driven by the output of the fourth filter resonator 106d. Additionally, the coupling capacitance, and thereby the bandwidth, of the filter resonators 106 can be defined by capacitors 108. For example, a third capacitor 108c can set the coupling capacitance of the third filter resonator 106c. Also, a fourth capacitor 108d can set the coupling capacitance of the fourth filter resonator 106d. In one or more embodiments, the filter resonators 106 can be band-pass filters, such as co-planar waveguides. Further, in various embodiments the signal control line 104 and/or the drive lines 110 can be superconducting resonator lines.

Figure 6:
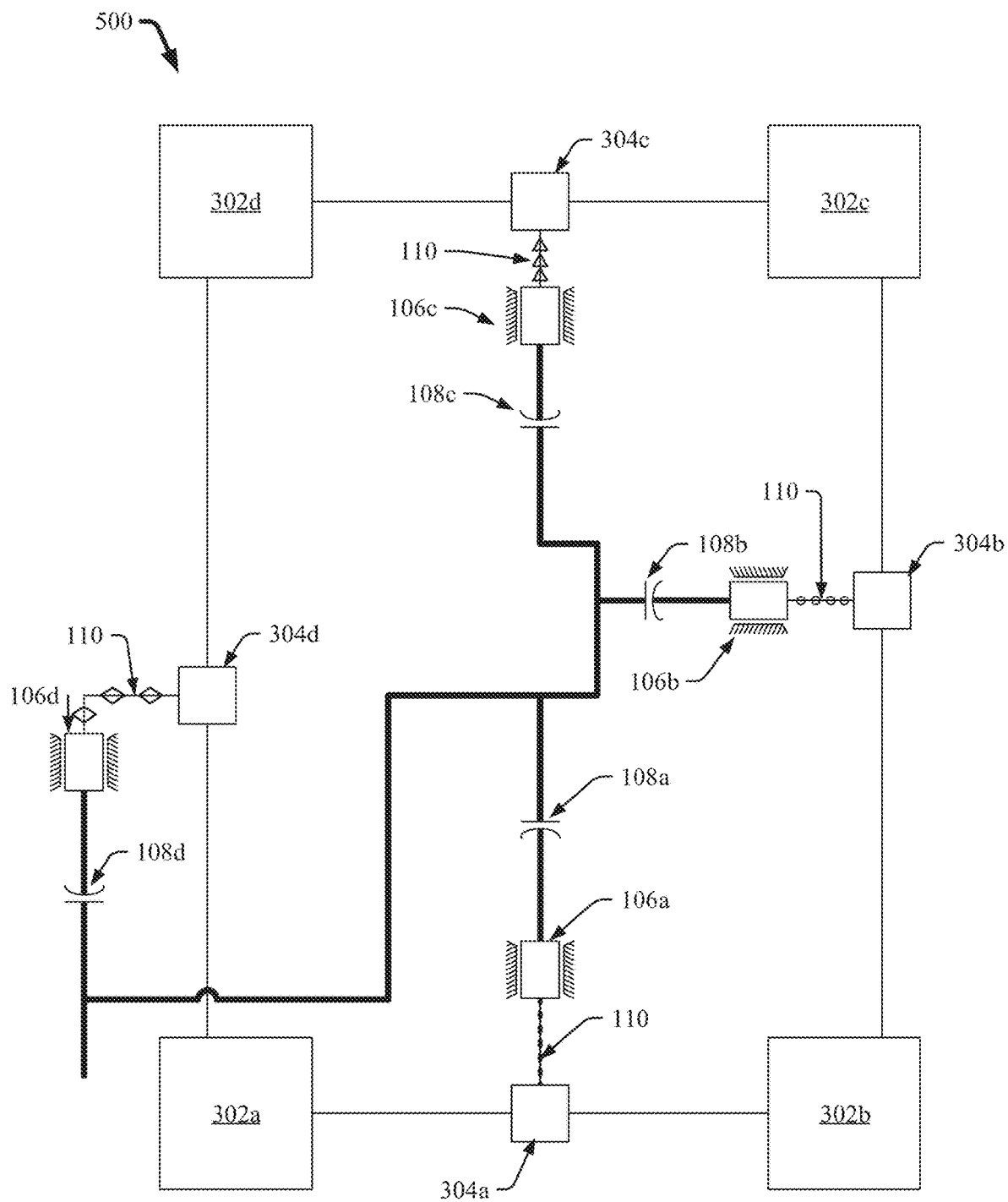
FIG. 6 illustrates a diagram of an example, non-limiting quantum circuit during operation, where the quantum circuit can comprise least four qubits operably coupled to at least four RIP gates driven from a single control line in accordance with one or more embodiments described herein.

FIG. 6 illustrates a diagram of the example, non-limiting quantum circuit 500 during operation, where a frequency multiplexed control signal 202 can be carried by the signal control line 104 to control the resonator buses 304 in accordance with one or more embodiments described herein. Repetitive description of like elements employed in other embodiments described herein is omitted for sake of brevity. FIG. 6 exemplifies how the quantum circuit 500 can route RIP gate signals to a plurality of resonator buses 304 from a single signal control line 104.

As shown in FIG. 6, the frequency multiplexed control signal 202 can be represented by a bold black line and can be carried by the signal control line 104. For example, the frequency multiplexed control signal 202 can be multiplexed with the first RIP gate signal 204a, the second RIP gate signal 204b, a third RIP gate signal 204c, and/or a fourth RIP gate signal 204d. In FIG. 6, the first RIP gate signal 204a can be represented by a dashed bold line carried on a drive line 110 coupled to the first filter resonator 106a. The second RIP gate signal 204b can be represented by a plurality of open circles carried on a drive line 110 coupled to the second filter resonator 106b. The third RIP gate signal 204c can be represented by a plurality of open triangles carried on a drive line 110 coupled to the third filter resonator 106c. The fourth RIP gate signal 204d can be represented by a plurality of open diamonds carried on a drive line 110 coupled to the fourth filter resonator 106d. In accordance with the various embodiments described herein, each of the RIP gate signals can be multiplexed to non-overlapping frequency bands. For example, the first RIP gate signal 204a (e.g., represented by dashed lines in FIG. 6) can be on a frequency sub-band centered at 6.2 GHz, the second RIP gate signal 204b (e.g., represented by open circles in FIG. 6) can be on a frequency sub-band centered at 6.3 GHz, the third RIP gate signal 204c (e.g., represented by open triangles in FIG. 6) can be on a frequency sub-band centered at 6.4 GHz, and/or the fourth RIP gate signal 204d (e.g., represented by open diamonds in FIG. 6) can be on a frequency sub-band centered at 6.5 GHz.

The signal control line 104 can carry the multiplexed control signal 202 (e.g., represented by a bold black line) to the first filter resonator 106a, which can thereby filter the multiplexed control signal 202 based on frequency to output the first RIP gate signal 204a (e.g., represented by a bold, dashed line). The first filter resonator 106a can output the first RIP gate signal 204a as a control tone that can be carried to the first resonator bus 304a via a drive line 110. The first filter resonator 106a can also block other RIP gate signals (e.g., the second RIP gate signal 204b, the third RIP gate signal 204c, and the fourth RIP gate signal 204d) from being carried to the first resonator bus 304a. Thus, the first resonator bus 304a can be driven by just the first RIP gate signal 204a outputted by the first filter resonator 106a, and crosstalk from other RIP gate signals can be reduced by the first filter resonator 106a. In accordance with various embodiments described herein, the first filter resonator 106a can be tuned to the frequency band of the first RIP gate signal 204a by adjusting the coupling capacitance established by the first capacitor 108a.

Additionally, the signal control line 104 can carry the multiplexed control signal 202 (e.g., represented by a bold black line) to the second filter resonator 106b, which can thereby filter the multiplexed control signal 202 based on frequency to output the second RIP gate signal 204b (e.g., represented by open circles). The second filter resonator 106b can output the second RIP gate signal 204b as a control tone that can be carried to the second resonator bus 304b via another drive line 110. Also, the second filter resonator 106b can block other RIP gate signals (e.g., the first RIP gate signal 204a, the third RIP gate signal 204c, and the fourth RIP gate signal 204d) from being carried to the second resonator bus 304b. Thus, the second resonator bus 304b can be driven by just the second RIP gate signal 204b outputted by the second filter resonator 106b, and crosstalk from other RIP gate signals can be reduced by the second filter resonator 106b. In accordance with various embodiments described herein, the second filter resonator 106b can be tuned to the frequency band of the second RIP gate signal 204b by adjusting the coupling capacitance established by the second capacitor 108b.

Further, the signal control line 104 can carry the multiplexed control signal 202 (e.g., represented by a bold black line) to the third filter resonator 106c, which can thereby filter the multiplexed control signal 202 based on frequency to output the third RIP gate signal 204c (e.g., represented by open triangles). The third filter resonator 106c can output the third RIP gate signal 204c as a control tone that can be carried to the third resonator bus 304c via another drive line 110. Also, the third filter resonator 106c can block other RIP gate signals (e.g., can block the first RIP gate signal 204a, the second RIP gate signal 204b, and the fourth RIP gate signal 204d) from being carried to the third resonator bus 304c. Thus, the third resonator bus 304c can be driven by just the third RIP gate signal 204c outputted by the third filter resonator 106c, and crosstalk from other RIP gate signals can be reduced by the third filter resonator 106c. In accordance with various embodiments described herein, the third filter resonator 106c can be tuned to the frequency band of the third RIP gate signal 204c by adjusting the coupling capacitance established by the third capacitor 108c.

Moreover, the signal control line 104 can carry the multiplexed control signal 202 (e.g., represented by a bold black line) to the fourth filter resonator 106d, which can thereby filter the multiplexed control signal 202 based on frequency to output the fourth RIP gate signal 204d (e.g., represented by open diamonds). The fourth filter resonator 106d can output the fourth RIP gate signal 204d as a control tone that can be carried to the fourth resonator bus 304d via another drive line 110. Also, the fourth filter resonator 106d can block other RIP gate signals (e.g., can block the first RIP gate signal 204a, the second RIP gate signal 204b, and the third RIP gate signal 204c) from being carried to the fourth resonator bus 304d. Thus, the fourth resonator bus 304d can be driven by just the fourth RIP gate signal 204d outputted by the fourth filter resonator 106d, and crosstalk from other RIP gate signals can be reduced by the fourth filter resonator 106d. In accordance with various embodiments described herein, the third filter resonator 106c can be tuned to the frequency band of the fourth RIP gate signal 204d by adjusting the coupling capacitance established by the fourth capacitor 108d.

By setting each capacitor 108 to a different capacitance, each filter resonator 106 can filter the multiplexed control signal 202 at different frequency bands. Thereby, each filter resonator 106 can output a different target RIP gate signal while inhibiting propagation of other RIP gate signals to the filter resonators' 106 respective resonator buses 304.

Figure 7:
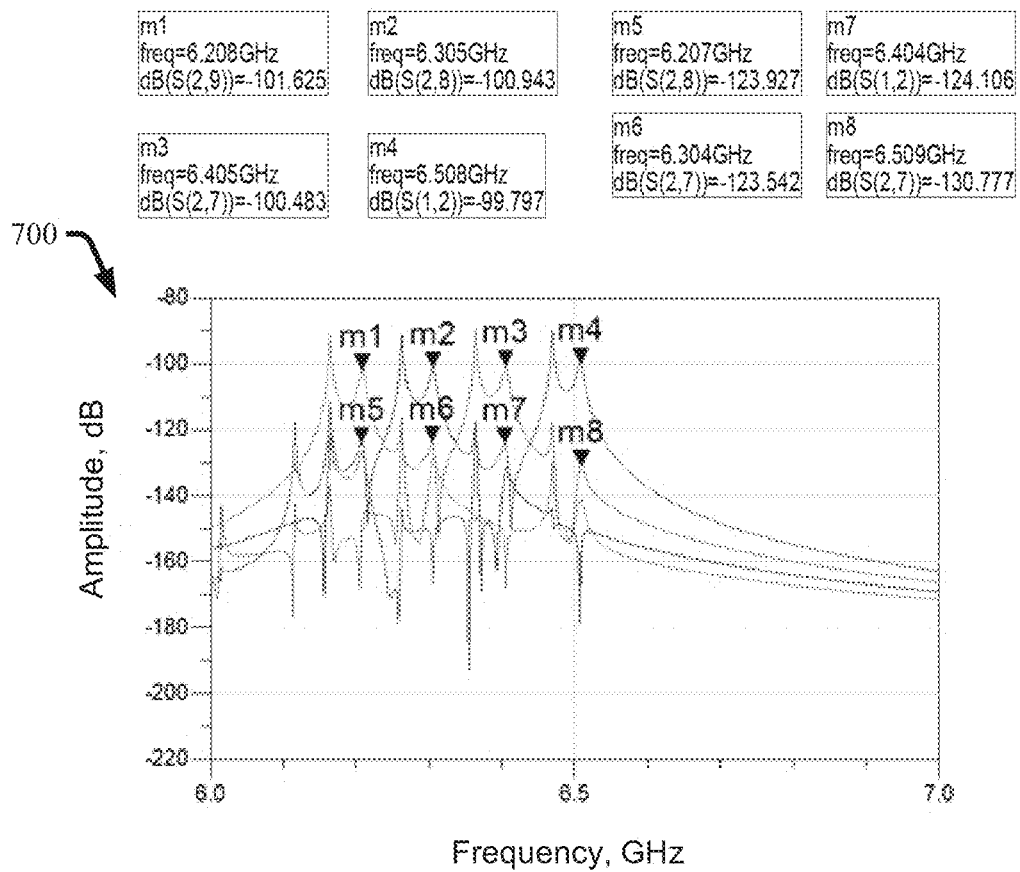
FIG. 7 illustrates a diagram of an example, non-limiting graph that demonstrates the efficacy of multiplexing a plurality of RIP gate signals in accordance with one or more embodiments described herein.

FIG. 7 illustrates a diagram of an example, non-limiting graph 700 that can demonstrate the operation of exemplary quantum circuit 500 depicted in FIG. 6 in accordance with one or more embodiments described herein. Repetitive description of like elements employed in other embodiments described herein is omitted for sake of brevity. Graph 700 characterizes an embodiment of the frequency multiplexing scheme 200 implemented on exemplary quantum circuit 500 in accordance with various embodiments described herein.

As shown in FIG. 7, the first RIP gate signal 204a can be delineated by "m1", the second RIP gate signal 204b can be delineated by "m2", the third RIP gate signal 204c can be delineated by "m3", and the fourth RIP gate signal 204d can be delineated by "m4". The frequency multiplexing scheme 200 illustrated in graph 700 can achieve at least 20 dB of resonator bus 304 selectivity at the target driving frequencies of the respective RIP gate signals (e.g., at the target driving frequencies of 6.2 GHz, 6.3 GHz, 6.4 GHz, and/or 6.4 GHz). For example, reference numerals "m5," "m6", "m7", and/or "m8" can delineate cross-talk that can occur outside the 20 dB selectivity range.

FIG. 8 illustrates a flow diagram of an example, non-limiting method 800 that can be implemented by one or more quantum circuits (e.g., circuit-QEDs) for controlling quantum gate coupling in accordance with one or more embodiments described herein. Repetitive description of like elements employed in other embodiments described herein is omitted for sake of brevity.

At 802, the method 800 can comprise setting, via a quantum circuit (e.g., as exemplified by exemplary quantum circuit 300 and/or 500), a bandwidth of a filter resonator 106 by adjusting a coupling capacitance between the filter resonator 106 and a signal control line 104 that can be multiplexed with a plurality of RIP gate signals. For example, the signal control line 104 can be frequency division multiplexed, such as the multiplexing exemplified in frequency multiplexing scheme 200 and/or graph 700. In various embodiments, the filter resonator 106 can be from a plurality of filter resonators 106 comprised within the same quantum circuit. Additionally, the filter resonator 106 can be a band-pass filter or a band-stop filter. In various embodiments, the filter resonator 106 can be a co-planar waveguide filter. In one or more embodiments, the setting the bandwidth at 802 can be performed by setting a capacitance of one or more capacitors 108 that couple the filter resonator 106 to the signal control line 104.

At 804, the method 800 can comprise controlling quantum gate coupling, via the quantum circuit (e.g., as exemplified by exemplary quantum circuit 300 and/or 500), by filtering a RIP gate signal from the signal control line 104, wherein the RIP gate signal can be filtered from the signal control line by the filter resonator based on frequency in accordance with the bandwidth. For example, the filter resonator 106 can be coupled to one or more RIP gates 102 (e.g., one or more resonator buses 304 that couple a plurality of qubits 302). In various embodiments, the signal control line 104 can drive a plurality of RIP gates 102, where crosstalk between the RIP gates 102 can be reduced by the filter resonators 106.

FIG. 9 illustrates a flow diagram of an example, non-limiting method 900 that can be implemented by one or more quantum circuits (e.g., circuit-QEDs) for controlling quantum gate coupling in accordance with one or more embodiments described herein. Repetitive description of like elements employed in other embodiments described herein is omitted for sake of brevity.

At 902, the method 900 can comprise multiplexing, via a quantum controller 112, a plurality of RIP gate signals onto a signal control line 104. For example, the signal control line 104 can be frequency division multiplexed, such as the multiplexing exemplified in frequency multiplexing scheme 200 and/or graph 700. In one or more embodiments, the multiplexing at 902 can be implemented by one or more quantum controllers 112 (e.g., via one or more multiplexers 114) that can stimulate a quantum circuit comprising the signal control line 104 (e.g., exemplary quantum circuit 300 and/or 500).

At 904, the method 900 can comprise routing, via a quantum circuit (e.g., as exemplified by exemplary quantum circuit 300 and/or 500), the signal control line 104 to one or more filter resonators 106. For example, the signal control line 104 can carry the multiplexed control signal 202 to the one or more filter resonators 106. As exemplified in at least FIGS. 1 and 3-6, the multiplexed control signal 204 can be carried to a plurality of filter resonators 106 by the signal control line 104.

At 906, the method 900 can comprise coupling, via the quantum circuit (e.g., as exemplified by exemplary quantum circuit 300 and/or 500), an output of the one or more filter resonators 106 to one or more RIP gates 102. For example, each filter resonator 106 can be coupled to a respective RIP gate 102 (e.g., coupled to a respective resonator bus 304 that couples two or more qubits 302). The output of the one or more filter resonators 106 can drive the RIP gates 102.

At 908, the method 900 can comprise setting, via the quantum circuit (e.g., as exemplified by exemplary quantum circuit 300 and/or 500), a bandwidth of the one or more filter resonators 106 by adjusting a coupling capacitance between the one or more filter resonators 106 and the signal control line 104. For example, the one or more filter resonators 106 can be coupled to the signal control line 104 via one or more capacitors 108. By adjusting the capacitance of the capacitors 108, the bandwidth of the filter resonators 106 can be tuned such that the filter resonators 106 output RIP gate signals driven at target frequency sub-bands. In various embodiments, one or more of the filter resonators 106 can be set to different bandwidths and can thereby filter the multiplexed control signal 202 based on different target frequencies.

At 910, the method 900 can comprise generating, via the quantum circuit (e.g., as exemplified by exemplary quantum circuit 300 and/or 500), the output by filtering, via the one or more filter resonators 106, a RIP gate signal from the plurality of RIP gate signals multiplexed at 902. For example, the filter resonators 106 can output individual RIP gate signals from the multiplexed control signal 202 based on targeted frequencies defined by the bandwidths set at 908. In various embodiments, each filter resonator 106 can output a respective RIP gate signal to drive respective RIP gates 102 at different frequencies.

Figure 10:
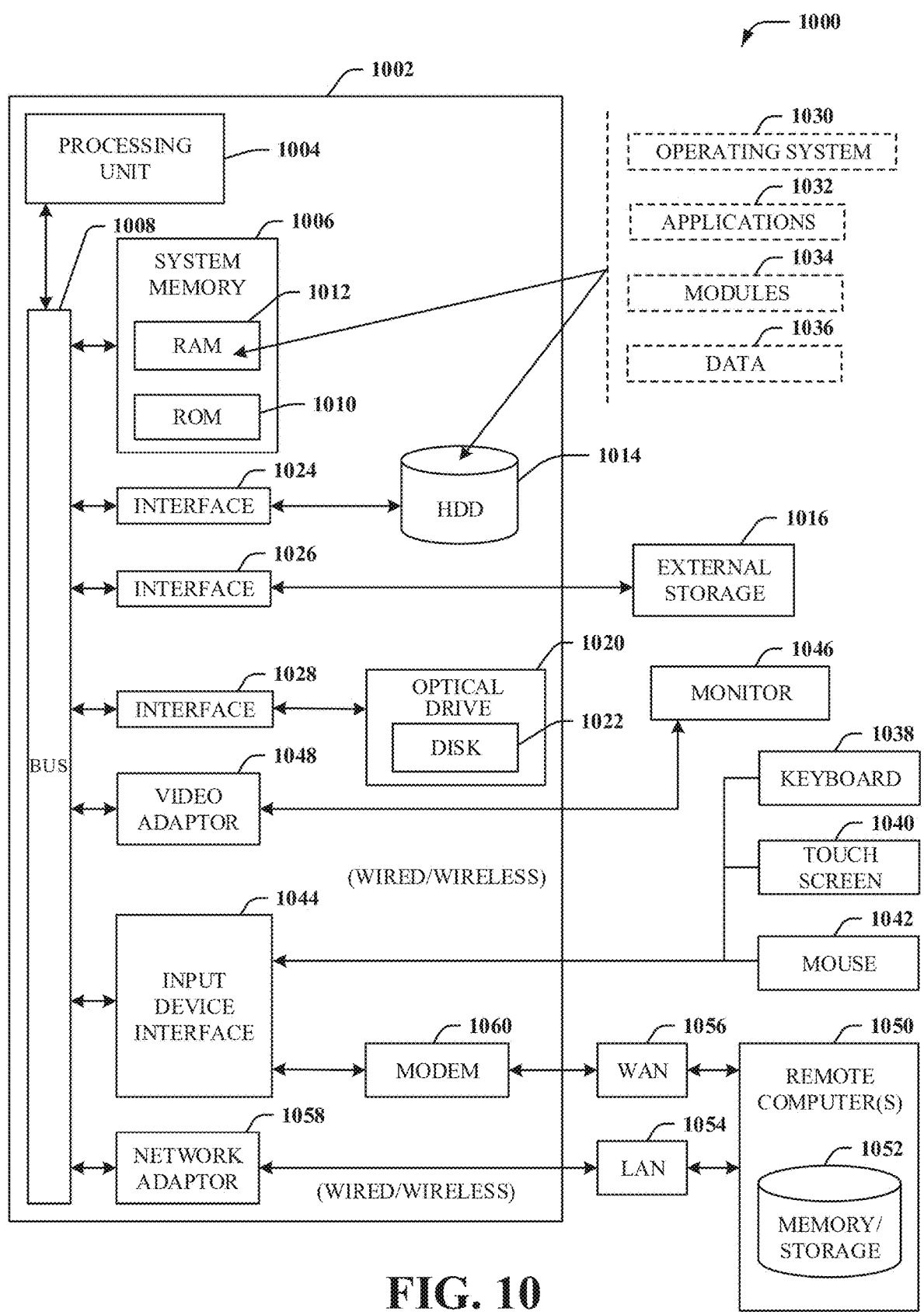
FIG. 10 illustrates a block diagram of an example, non-limiting operating environment in which one or more embodiments described herein can be facilitated.

In order to provide additional context for various embodiments described herein, FIG. 10 and the following discussion are intended to provide a general description of a suitable computing environment 1000 in which the various embodiments of the embodiment described herein can be implemented. In various embodiments, computing environment 1000 can exemplify one or more architectural features of the quantum controller 112 and/or one or more computer devices employed to communicate with, and/or provide inputs to, the quantum controller 112. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things ("IoT") devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory ("RAM"), read only memory ("ROM"), electrically erasable programmable read only memory ("EEPROM"), flash memory or other memory technology, compact disk read only memory ("CD-ROM"), digital versatile disk ("DVD"), Blu-ray disc ("BD") or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 10, the example environment 1000 for implementing various embodiments of the aspects described herein includes a computer 1002, the computer

1002 including a processing unit 1004, a system memory 1006 and a system bus 1008. The system bus 1008 couples system components including, but not limited to, the system memory 1006 to the processing unit 1004. The processing unit 1004 can be any of various commercially available processors. Dual microprocessors and other multi-processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes ROM 1010 and RAM 1012. A basic input/output system ("BIOS") can be stored in a non-volatile memory such as ROM, erasable programmable read only memory ("EPROM"), EEPROM, which BIOS contains the basic routines that help to transfer information between elements within the computer 1002, such as during startup. The RAM 1012 can also include a high-speed RAM such as static RAM for caching data.

The computer 1002 further includes an internal hard disk drive ("HDD") 1014 (e.g., EIDE, SATA), one or more external storage devices 1016 (e.g., a magnetic floppy disk drive ("FDD") 1016, a memory stick or flash drive reader, a memory card reader, etc.) and an optical disk drive 1020 (e.g., which can read or write from a CD-ROM disc, a DVD, a BD, etc.). While the internal HDD 1014 is illustrated as located within the computer 1002, the internal HDD 1014 can also be configured for external use in a suitable chassis (not shown). Additionally, while not shown in environment 1000, a solid state drive ("SSD") could be used in addition to, or in place of, an HDD 1014. The HDD 1014, external storage device(s) 1016 and optical disk drive 1020 can be connected to the system bus 1008 by an HDD interface 1024, an external storage interface 1026 and an optical drive interface 1028, respectively. The interface 1024 for external drive implementations can include at least one or both of Universal Serial Bus ("USB") and Institute of Electrical and Electronics Engineers ("IEEE") 1394 interface technologies. Other external drive connection technologies are within contemplation of the embodiments described herein.

The drives and their associated computer-readable storage media provide nonvolatile storage of data, data structures, computer-executable instructions, and so forth. For the computer 1002, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. The systems and methods described herein can be implemented utilizing various commercially available operating systems or combinations of operating systems.

Computer 1002 can optionally comprise emulation technologies. For example, a hypervisor (not shown) or other intermediary can emulate a hardware environment for operating system 1030, and the emulated hardware can optionally be different from the hardware illustrated in FIG. 10. In such an embodiment, operating system 1030 can comprise one virtual machine ("VM") of multiple VMs hosted at computer 1002. Furthermore, operating system 1030 can provide runtime environments, such as the Java runtime environment or the .NET framework, for applications 1032. Runtime environments are consistent execution environments that allow applications 1032 to run on any operating system that includes the runtime environment. Similarly, operating system 1030 can support containers, and applications 1032 can be in the form of containers, which are lightweight, standalone, executable packages of software that include, e.g., code, runtime, system tools, system libraries and settings for an application.

Further, computer 1002 can be enable with a security module, such as a trusted processing module ("TPM"). For instance with a TPM, boot components hash next in time boot components, and wait for a match of results to secured values, before loading a next boot component. This process can take place at any layer in the code execution stack of computer 1002, e.g., applied at the application execution level or at the operating system ("OS") kernel level, thereby enabling security at any level of code execution.

A user can enter commands and information into the computer 1002 through one or more wired/wireless input devices, e.g., a keyboard 1038, a touch screen 1040, and a pointing device, such as a mouse 1042. Other input devices (not shown) can include a microphone, an infrared ("IR") remote control, a radio frequency ("RF") remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1004 through an input device interface 1044 that can be coupled to the system bus 1008, but can be connected by other interfaces, such as a parallel port, an IEEE 1394 serial port, a game port, a USB port, an IR interface, a BLUETOOTH® interface, etc.

A monitor 1046 or other type of display device can be also connected to the system bus 1008 via an interface, such as a video adapter 1048. In addition to the monitor 1046, a computer typically includes other peripheral output devices (not shown), such as speakers, printers, etc.

The computer 1002 can operate in a networked environment using logical connections via wired and/or wireless communications to one or more remote computers, such as a remote computer(s) 1050. The remote computer(s) 1050 can be a workstation, a server computer, a router, a personal computer, portable computer, microprocessor-based entertainment appliance, a peer device or other common network node, and typically includes many or all of the elements described relative to the computer 1002, although, for purposes of brevity, only a memory/storage device 1052 is illustrated. The logical connections depicted include wired/wireless connectivity to a local area network ("LAN") 1054 and/or larger networks, e.g., a wide area network ("WAN") 1056. Such LAN and WAN networking environments are commonplace in offices and companies, and facilitate enterprise-wide computer networks, such as intranets, all of which can connect to a global communications network, e.g., the Internet.

When used in a LAN networking environment, the computer 1002 can be connected to the local network 1054 through a wired and/or wireless communication network interface or adapter 1058. The adapter 1058 can facilitate wired or wireless communication to the LAN 1054, which can also include a wireless access point ("AP") disposed thereon for communicating with the adapter 1058 in a wireless mode.

When used in a WAN networking environment, the computer 1002 can include a modem 1060 or can be connected to a communications server on the WAN 1056 via other means for establishing communications over the WAN 1056, such as by way of the Internet. The modem 1060, which can be internal or external and a wired or wireless device, can be connected to the system bus 1008 via the input device interface 1044. In a networked environment, program modules depicted relative to the computer 1002 or portions thereof, can be stored in the remote memory/storage device 1052. It will be appreciated that the network connections shown are example and other means of establishing a communications link between the computers can be used.

When used in either a LAN or WAN networking environment, the computer 1002 can access cloud storage systems or other network-based storage systems in addition to, or in place of, external storage devices 1016 as described above. Generally, a connection between the computer 1002 and a cloud storage system can be established over a LAN 1054 or WAN 1056 e.g., by the adapter 1058 or modem 1060, respectively. Upon connecting the computer 1002 to an associated cloud storage system, the external storage interface 1026 can, with the aid of the adapter 1058 and/or modem 1060, manage storage provided by the cloud storage system as it would other types of external storage. For instance, the external storage interface 1026 can be configured to provide access to cloud storage sources as if those sources were physically connected to the computer 1002.

The computer 1002 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity ("Wi-Fi") and BLUETOOTH® wireless technologies. Thus, the communication can be a predefined structure as with a conventional network or simply an ad hoc communication between at least two devices.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    controlling quantum gate coupling, via a quantum circuit, by filtering a resonator induced phase gate signal from a signal control line that is multiplexed with a plurality of resonator induced phase gate signals; and
    setting, via the quantum circuit, a bandwidth of a filter resonator by adjusting a coupling capacitance between the filter resonator and the signal control line, wherein the resonator induced phase gate signal is filtered from the signal control line by the filter resonator based on frequency in accordance with the bandwidth.

2. The method of claim 1, wherein the filtering is performed by the filter resonator coupled between the signal control line and a resonator bus.

3. The method of claim 2, wherein the resonator bus is a resonator induced phase gate between a plurality of superconducting qubits.

4. The method of claim 1, wherein the plurality of resonator induced phase gate signals are multiplexed, via a quantum controller, onto the signal control line via frequency division multiplexing, and wherein the filtering is based on a frequency of the resonator induced phase gate signal.

5. A method, comprise:
    routing, via a quantum circuit, a signal control line to a filter resonator, wherein a plurality of resonator induced phase gate signals are multiplexed onto the signal control line; and
    coupling, via the quantum circuit, an output of the filter resonator to a resonator induced phase gate; and
    setting, via the quantum circuit, a coupling capacitance between a filter resonator and the signal control line, wherein the filter resonator selects the resonator induced phase gate signal from the plurality of resonator induced phase gate signals based on the coupling capacitance.

6. The method of claim 5, wherein the output of the filter resonator is a resonator induced phase gate signal from the plurality of resonator induced phase gate signals.

7. The method of claim 6, wherein the filter resonator from a plurality of filter resonators, wherein the resonator induced phase gate is from a plurality of resonator induced phase gates, and wherein the method further comprises coupling, via the quantum circuit, a second output of a second filter resonator from the plurality of filter resonators to a second resonator induced phase gate that couples another plurality of superconducting qubits.

8. The method of claim 7, wherein the second output of the second filter resonator is a second resonator induced phase gate signal from the plurality of resonator induced phase gate signals, and wherein the resonator induced phase gate signal is different than the second resonator induced phase gate signal.

9. The method of claim 5, wherein the filter resonator inhibits a second resonator induced phase gate signal from the plurality of resonator induced phase gate signals from being transmitted to the resonator induced phase gate.

10. The method of claim 5, wherein the multiplexing is a frequency division multiplexing, and wherein the filter resonator produces the output by filtering the signal control line based on frequencies of the plurality of resonator induced phase gate signals.

11. The method of claim 5, further comprising:
setting, via the quantum circuit, a bandwidth of the filter resonator by adjusting a coupling capacitance between the filter resonator and the signal control line; and
generating, via the quantum circuit, the output by filtering, via the filter resonator, a resonator induced phase gate signal from the plurality of resonator induced phase gate signals.

12. The method of claim 11, wherein the filter resonators the resonator induced phase gate signal by frequency based on the bandwidth.

13. A system, comprising:
a resonator bus coupled to a filter resonator, wherein the filter resonator outputs a control tone that drives the resonator bus from a plurality of control tones multiplexed onto a quantum gate control line; and
a capacitor that couples the filter resonator to the quantum gate control line, wherein a frequency of the control tone is based on a capacitance of the capacitor.

14. The system of claim 13, wherein the system is a multi-qubit circuit quantum electrodynamics system.

15. The system of claim 13, wherein the filter resonator is selected from the group consisting of a band-pass filter and a band-stop filter.

16. The system of claim 13, wherein the quantum gate control line is multiplexed with a plurality of control tones, and wherein the control tone is from the plurality of control tones.

17. The system of claim 13, wherein the control tone is a resonator induced phase gate signal and the resonator bus is a resonator induced phase gate.

* * * * *